US006620697B1

United States Patent
Alok et al.

(10) Patent No.: US 6,620,697 B1
(45) Date of Patent: Sep. 16, 2003

(54) SILICON CARBIDE LATERAL METAL-OXIDE SEMICONDUCTOR FIELD-EFFECT TRANSISTOR HAVING A SELF-ALIGNED DRIFT REGION AND METHOD FOR FORMING THE SAME

(75) Inventors: Dev Alok, Danbury, CT (US); Rik Jos, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/961,982

(22) Filed: Sep. 24, 2001

(51) Int. Cl.[7] .............................................. H01L 21/336
(52) U.S. Cl. ...................... 438/301; 438/931; 438/303; 438/306
(58) Field of Search .................................. 438/931, 301

(56) References Cited

U.S. PATENT DOCUMENTS

| 4,300,150 A | * 11/1981 | Colak ........................ 257/336 |
| 5,229,633 A | * 7/1993 | Fisher et al. ................ 257/339 |
| 5,374,843 A | * 12/1994 | Williams et al. ............ 257/492 |
| 5,559,348 A | * 9/1996 | Watabe et al. ............... 257/141 |
| 5,569,937 A | * 10/1996 | Bhatnagar et al. ............ 257/77 |
| 5,622,878 A | * 4/1997 | Beasom ....................... 438/266 |
| 5,627,385 A | * 5/1997 | Bhatnagar et al. ............ 257/77 |
| 5,710,455 A | * 1/1998 | Bhatnagar et al. .......... 257/472 |
| 5,963,791 A | * 10/1999 | Brown et al. ................ 438/105 |
| 6,011,278 A | * 1/2000 | Alok et al. .................... 257/76 |
| 6,127,695 A | * 10/2000 | Harris et al. .................. 257/77 |
| 6,323,506 B1 | * 11/2001 | Alok ............................. 257/77 |
| 6,355,944 B1 | * 3/2002 | Alok ............................. 257/77 |

FOREIGN PATENT DOCUMENTS

| WO | WO0147025 | 11/2000 | ............ H01L/29/78 |
| WO | WO0147026 | 11/2000 | ............ H01L/29/78 |

* cited by examiner

Primary Examiner—John F. Niebling
Assistant Examiner—Angel Roman
(74) Attorney, Agent, or Firm—Steven R. Biren

(57) ABSTRACT

A silicon carbide lateral metal-oxide-semiconductor field-effect transistor (SiC LMOSFET) having a self-aligned drift region and method for forming the same is provided. Specifically, the SiC LMOSFET includes a source region, a drift region and a drain region. The source and drain regions are implanted using non self-aligned technology (i.e., prior to formation of the gate electrode and the gate oxide layer), while the drift region is implanted using self-aligned technology (i.e., after formation of the gate electrode and the gate oxide layer). By self-aligning the drift region to the gate electrode, the overlap between the two is minimized, which reduces the capacitance of the device. When capacitance is reduced, performance is improved.

5 Claims, 3 Drawing Sheets

SILICON CARBIDE LATERAL METAL-OXIDE SEMICONDUCTOR FIELD-EFFECT TRANSISTOR HAVING A SELF-ALIGNED DRIFT REGION AND METHOD FOR FORMING THE SAME

BACKGROUND OF THE INVENTION

1. Technical Field

In general, the present invention relates to a silicon carbide (SiC) lateral metal-oxide-semiconductor field-effect transistor (LMOSFET). In particular, the present invention provides a SiC LMOSFET having a self-aligned drift region and method for forming the same.

2. Background Art

In recent years, silicon (Si) lateral diffused metal-oxide semiconductor field effect transistors (LDMOSFETs) have gained wide acceptance in a variety of high power and high frequency applications. Si LDMOSFETs offer simpler gate drive and lower signal distortion in comparison to bipolar-based devices. LDMOSFETs in the silicon field are made using self-aligned technology to reduce the overlap between the gate and source/drift regions. The reduction of this overlap is important as it reduces the gate-source and gate-drain capacitance, which can adversely affect the high frequency performance of the device. It is also desirable to reduce the overlap to decrease the cell pitch and conserve the silicon area used by the device.

In producing an LDMOSFET using self-aligned technology, a gate contact is formed on top of a gate oxide layer. Once formed, an N+ source region and a P base region are diffused from the source side of the device while an N− drift region is diffused from the drain side. This diffusion makes the source, base, and drift regions self aligned to the gate electrode. Since the diffusion temperature in Si technology is about 900–1100° C., neither the gate electrode nor the gate oxide layer is affected in any adverse fashion.

More recent advancements in technology have lead to the use of SiC as a substitute for Si in constructing lateral MOSFETs for high frequency and high power applications. However, when using SiC, diffusion of dopants is extremely difficult. Hence, only high-energy ion implantation can be used, which requires annealing temperatures in excess of 1500° C. Such high temperatures are extremely harmful to the gate oxide layer and the gate electrode. Accordingly, the source, drain, and drift regions must be implanted and annealed prior to formation of the gate oxide layer and gate electrode. This technology is referred to as non self-aligned technology and results in larger overlaps for both the source and drift regions with the gate electrode. As indicated above, as overlap increases, the capacitance of the device also increases. Higher capacitance adversely affects device performance. This is especially the case with respect to the overlap between the drift region and the gate contact since the drain to gate capacitance is a feedback capacitance (i.e., Miller capacitance).

In view of the foregoing, there exists a need for a SiC LMOSFET in which the source, drain, and drift regions can be implanted without adversely affecting the gate oxide layer or gate electrode. In addition, a need exists for the drift region to be self-aligned with the gate electrode so that the overlap between the gate contact and drift region is minimized. By minimizing the overlap, the capacitance of the device is minimized and performance is improved.

SUMMARY OF THE INVENTION

The present invention solves the problems with existing art by providing a silicon carbide (SiC) lateral metal-oxide semiconductor field-effect transistor (LMOSFET) in which the drift region is self-aligned with the gate electrode. By self-aligning the drift region with the gate electrode, the drain to gate capacitance is substantially reduced, which improves performance of the device. In general, the SiC LMOSFET is formed by implanting the N+ source and drain regions in an epitaxial layer. After implantation, the regions are annealed at high temperatures. Then, the gate oxide layer and gate electrode are formed. Once the gate electrode has been formed, the N− drift region is implanted and then annealed. Since the drift region is doped with a lower implant dose, lower annealing temperatures can be used. Such lower temperatures do not seriously affect the gate oxide layer or gate electrode. Moreover, since the drift region is implanted after formation of the gate electrode, the drift region is self-aligned with the gate electrode (i.e., the overlap is minimized).

According to a first aspect of the present invention, a silicon carbide lateral metal-oxide-semiconductor field-effect transistor (SiC LMOSFET) is provided. The SiC LMOSFET comprises: (1) a source region, a drain region, and a drift region implanted in an epitaxial layer; and (2) a gate electrode formed over the epitaxial layer, wherein the drift region is self-aligned with the gate electrode.

According to a second aspect of the present invention, a silicon carbide lateral metal-oxide-semiconductor field-effect transistor (SiC LMOSFET) is provided. The SiC LMOSFET comprises: (1) a silicon carbide substrate; (2) an epitaxial layer formed on the silicon carbide substrate; (3) a source region, a drain region, and a drift region implanted in the epitaxial layer; (4) a gate electrode formed over the epitaxial layer; and (5) wherein the drift region is self-aligned with the gate electrode, and wherein the source region is non self-aligned with the gate electrode.

According to a third aspect of the present invention a method for forming a silicon carbide lateral metal-oxide-semiconductor field-effect transistor (SiC LMOSFET) is provided. The method comprises the steps of: (1) implanting a source region and a drain region in an epitaxial layer; (2) annealing the implanted source region and the implanted drain region; (3) forming a gate oxide layer and a gate electrode over the epitaxial layer; (4) implanting a drift region in the epitaxial layer; and (5) annealing the implanted drift region.

According to a fourth aspect of the present invention a method for forming a silicon carbide lateral metal-oxide-semiconductor field-effect transistor (SiC LMOSFET) is provided. The method comprises the steps of: (1) implanting a source region and a drain region in an epitaxial layer, wherein the epitaxial layer is formed on a silicon carbide substrate; (2) annealing the implanted source region and the implanted drain region at approximately 1600° C.; (3) forming a gate oxide layer over the epitaxial layer after the source region and the drain region are annealed; (4) forming a gate electrode on the gate oxide layer; (5) implanting a drift region in the epitaxial layer after the gate electrode is formed; and (6) annealing the implanted drift region at approximately 1250° C.

Therefore, the present invention provides a SiC LMOSFET having a self-aligned drift region and a method for forming the same.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
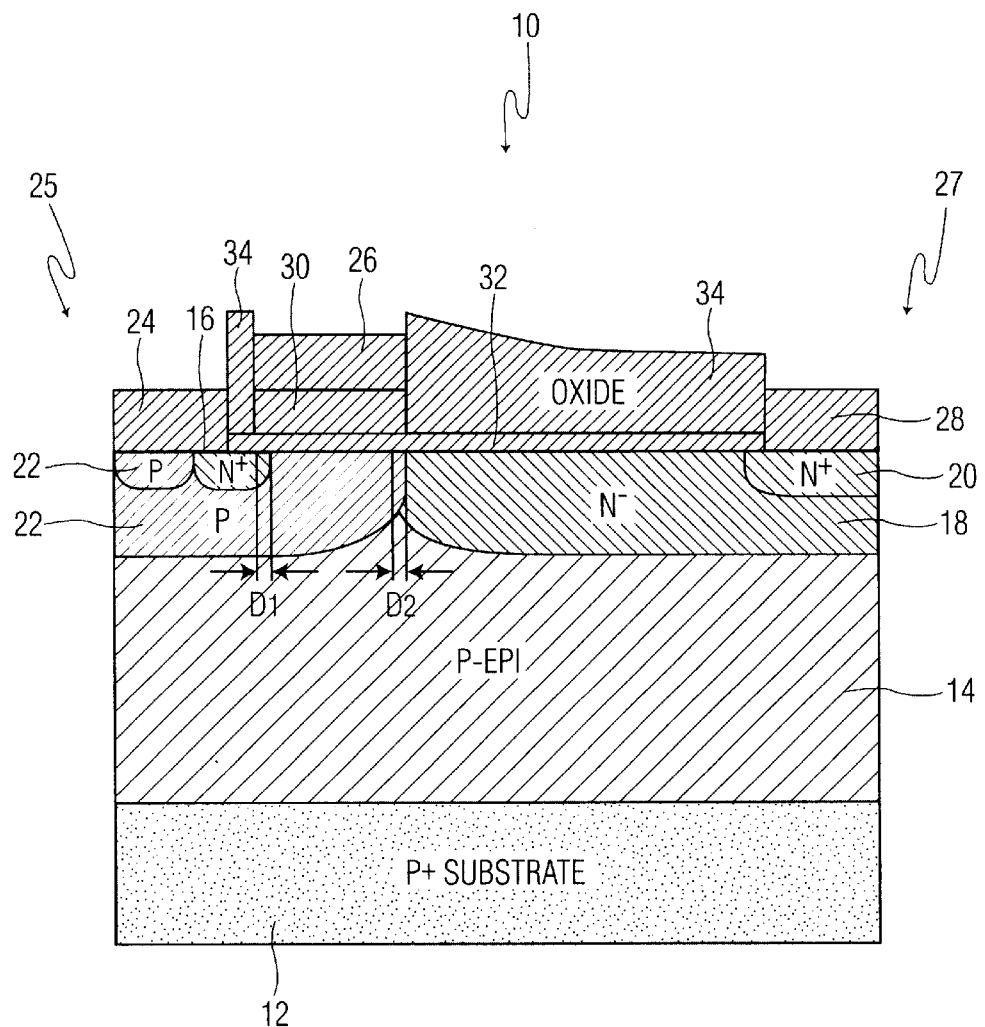
FIG. 1 depicts a related art Si LDMOSFET formed using self-aligned technology.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

Referring now to FIG. 1, a related art silicon laterally diffused metal-oxide field-effect transistor (Si LDMOSFET) 10 is depicted. Si LDMOSFET 10 is well known in the art and generally comprises P+ doped Si substrate 12, P− doped epitaxial layer 14, N+ doped source region 16, N− doped drift region 18, N+ doped drain region 20, P doped base 22, source contact 24, gate contact 26, drain contact 28, and gate electrode 30, gate oxide layer 32 and passivation oxide layers 34.

As indicated above, N+ source region 16 and P base region 22 are diffused from the source side 25, while N− drift region 18 and N+ drain region 20 are diffused from the drain side 27 of the device. In constructing Si LDMOSFET 10, self-aligned technology can be used meaning that gate oxide layer 32 and gate electrode 30 are formed prior to diffusion of regions 16, 18, 20, and 22. As shown, N+ source region 14 and N− drift region 18 both overlap gate electrode 30 by distances D1 and D2, respectively. It is important to provide a device with minimal overlap so that the capacitance is minimized. When capacitance is minimized, device performance is improved.

Figure 2:
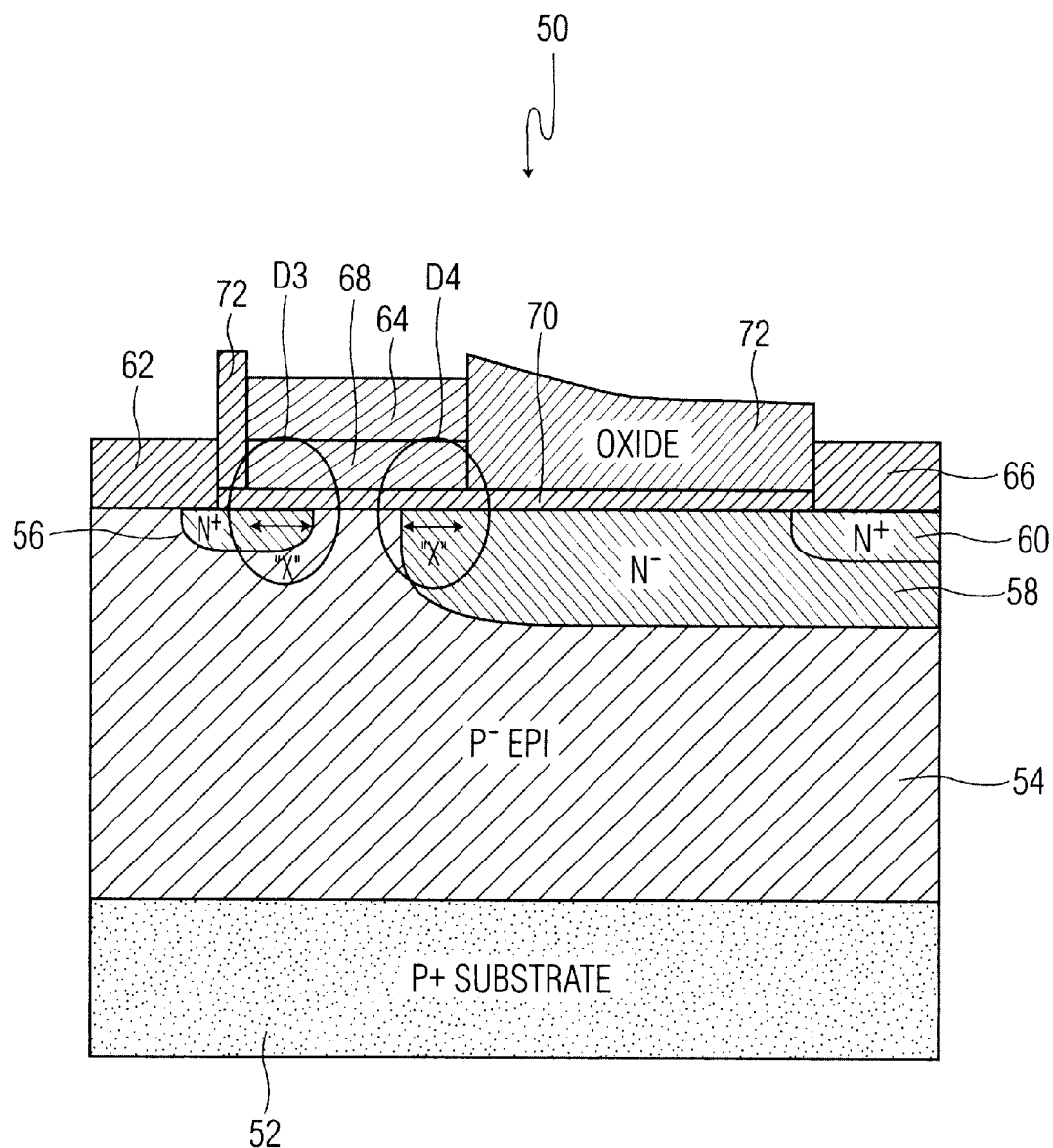
FIG. 2 depicts a related art SiC LMOSFET formed using non self-aligned technology

Referring now to FIG. 2, a related art silicon carbide lateral metal-oxide field-effect transistor (SiC LMOSFET) 50 is depicted. As shown, SiC LMOSFET 50 generally comprises P+ doped silicon carbide substrate 52, P− doped epitaxial layer 54, N+ doped source region 56, N− doped drift layer 58, N+ doped drain region 60, source contact 62, gate contact 64, drain contact 66, gate electrode 68, gate oxide layer 70, and passivation oxide layers 72. As indicated above, a SiC LMOSFET is highly desirable in high frequency and high power applications. However, it is not possible to diffuse the dopants in SiC as in Si. Accordingly, only high-energy ion implantation can be used to fabricate regions 56, 58, and 60. When performing a high-energy ion implantation, high annealing temperatures are required, which adversely affects the gate electrode 68 and gate oxide layer 70. Thus, a non-self aligned technology is used to form SiC LMOSFET 50. Specifically, regions 56, 58, and 60 are implanted prior to formation of gate electrode 68 and gate oxide layer 70. However, when using non self-aligned technology, large overlaps result. As shown, source region 56 and drift region 58 exhibited large overlaps D3 and D4 (significantly larger than overlaps D1 and D2 of Si LDMOSFET 10). Such overlaps increase capacitance of the device, which harms performance.

As further shown in FIG. 2, SiC LMOSFET 50 lacks a P base region. P base region is eliminated for at least two reasons. First, implantation of P base region also requires high annealing temperatures, which are harmful to gate oxide layer 70 and gate electrode 68. Second, when forming a channel on a P base region, extremely low inversion layer mobility (<1 cm$^2$/Vs) is obtained. Accordingly, by forming SiC LMOSFET 50 without P base region, the channel is formed directly on P− epitaxial layer 54. When forming the channel on the P− epitaxial layer as shown, inversion layer mobility higher than 100 cm$^2$/Vs can be obtained. Irrespective of this improved inversion layer mobility, SiC LMOSFET 50 still exhibits reduced performance due to the large overlaps D3 and D4 caused by the use of non self-aligned technology.

Figure 3:
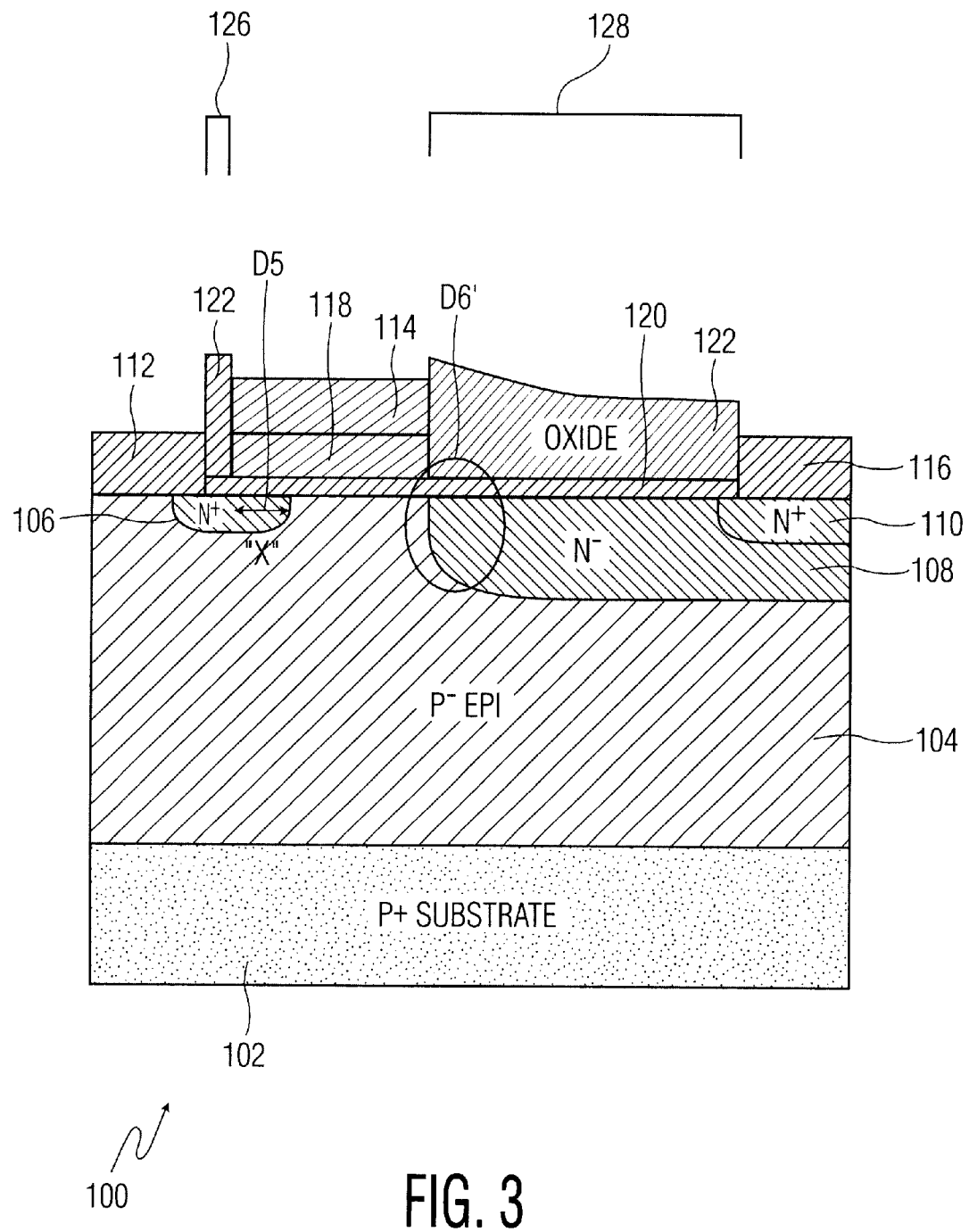
FIG. 3 depicts a SiC LMOSFET, according to the present invention, formed using self-aligned technology.

Referring now to FIG. 3, SiC LMOSFET 100 according to the present invention is shown. As depicted, SiC LMOSFET 100 generally comprises P+ doped SiC substrate 102, P− doped epitaxial layer 104, N+ doped source region 106, N− doped drift region 108, N+ doped drain region 110, source contact 112, gate contact 114, drain contact 116, gate electrode 118, gate oxide layer 120 and passivation oxide layers 122. Under the present invention, drift region 108 of SiC MOSFET 100 is self-aligned with gate electrode 118, while source region 106 and drain region 110 are non self-aligned with gate electrode 118. For the purposes of this disclosure, self-aligned means to minimize drift region overlap D6 by forming drift region 108 after formation of gate electrode 118 and gate oxide layer 120.

As indicated above, source region overlap D5 and drift region overlap D6 should be minimized to reduce capacitance of the device. This is especially the case with respect to drift region overlap D6 because the drain to gate capacitance is a feedback capacitance in the usually common-source application (i.e., Miller capacitance). Thus, the capability to reduce drift region overlap D6 will greatly improve performance of SiC LMOSFET 100. Under the present invention, drift region overlap D6 is reduced by implanting drift region 108 using self-aligned technology (i.e., after formation of gate electrode 118 and gate oxide layer 120). This is possible because drift region 108 is doped with a low implant dose that requires lower annealing temperatures in SiC. Such lower temperatures do no seriously affect gate electrode 118 or gate oxide layer 120. Conversely, source region 106 and drain region 110 are doped with a high implant dose that requires higher annealing temperatures in SiC. Accordingly, source region 106 and drain region 110 are implanted using non self-aligned technology (i.e., prior to formation of gate electrode 118 and gate oxide layer 120) so that gate electrode 118 or gate oxide layer 120 are not adversely affected.

Thus, under the present invention, source and drain regions 106 and 110 are first implanted in epitaxial layer 104 and annealed. As indicated above, since source and drain regions 106 and 110 are doped with a high implant dose, higher annealing temperatures of approximately 1600° C. are required to achieve acceptable levels of ion activation. Once source region 106 and drain region 110 have been annealed, gate electrode 118 and gate oxide layer 120 are formed using any known means. Had source and drain regions 106 and 110 been implanted and annealed after formation of gate electrode 118 and gate oxide layer 120 (i.e., using self-aligned technology), gate electrode 118 and gate oxide layer 120 would have been harmed by the high temperatures. Upon formation of gate electrode 118 and gate oxide layer 120, drift region 108 is implanted. Once implanted, drift region 108 will be annealed at the lower temperature of approximately 1250° C. (i.e., due to drift region's 108 doping with a low implant dose). Although this temperature is higher than used when forming the Si LDMOSFET of FIG. 1, it will not seriously harm gate electrode 118 and/or gate oxide layer 120. The result is a SiC LMOSFET in which the drift region 108 is self-aligned with the gate electrode 118 so that the overlap between the two is reduced. As shown in FIG. 3, drift region overlap D6 is minimal.

Table I below depicts approximate ion activation percentage for regions doped with low and high implant doses and annealed at approximately 1250° C. and 1600° C.

TABLE I

|  |  | IMPLANT DOSE | |
|---|---|---|---|
|  |  | LOW | HIGH |
| ANNEAL TEMPERATURE | 1250° C. | 38% | 0.1% |
|  | 1600° C. | 58% | 11% |

As shown, for regions doped with low implant doses, annealing temperatures of approximately 1250° C. resulted in approximately 38% ion activation. In contrast, regions doped with high implant doses and annealed at approximately 1250° C. exhibited only about 0.1% ion activation. Thus, annealing at a temperature of approximately 1250° C. was sufficient only for regions doped with low implant doses, such as N− drift region 108. In contrast, regions doped with high implants doses require an annealing temperature of approximately 1600° C. to achieve approximately 11% ion activation, compared to 58% ion activation for regions doped with low implant doses and annealed at the same temperature. In view of these results, N+ source and drain regions 106 and 110 should be annealed at a temperature of at least 1600° C. Conversely, since N− drift region 108 is doped with a low implant dose, it can be annealed at approximately 1250° C., which will not seriously harm gate electrode 118 and/or gate oxide layer 120. In view of this, drift region 108 can be implanted after forming gate electrode 118 and gate oxide layer 120 (i.e., self-aligned) so that drift region overlap D6 is minimized, thereby reducing drain to gate capacitance.

Once drift region 108 has been annealed, SiC LMOSFET 100 can be completed by performing any known processing steps. For example, a passivation layer 122 can be applied and region contacts (not shown) can be formed to source region 106 and drain region 110.

It should be understood that other than the method used in implanting regions 106, 108, and 110, the process and materials used to form the other components of SiC LMOSFET 100 (e.g., epitaxial layer 104, source contact 112, gate contact 114, and drain contact 116) are not intended to be a limiting part of the present invention. For example, gate electrode 118 could be polysilicon while gate contact 114 could be aluminum. Further, epitaxial layer 104 can be formed on SiC substrate 102 using any known method. It should also be understood that contacts 112, 114, and 116 are preferably formed by applying a metal layer (e.g., aluminum) over epitaxial layer 104, and then patterning using any means known in the art. Patterning should be performed so that gaps 126 and 128 separate gate contact 114 from source contact 112 and drain contact 116, respectively. Gap 126 isolates source contact 112 from gate electrode 118. Gap 128 determines the blocking voltage (performance) of LMOSFET 100.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for forming a silicon carbide lateral metal-oxide-semiconductor field-effect transistor (SiC LMOSFET), comprising the steps of:

implanting a source region and a drain region in an epitaxial layer, wherein the epitaxial layer is formed on a silicon carbide substrate;

annealing the implanted source region and the implanted drain region at approximately 1600° C.;

forming a gate oxide layer over the epitaxial layer after the source region and the drain region are annealed;

forming a gate electrode on the gate oxide layer;

implanting a drift region in the epitaxial layer after the gate electrode is formed; and annealing the implanted drift region at approximately 1250° C.

2. The method of claim 1, further comprising the step of forming a source contact and a drain contact over the epitaxial layer, and a gate contact over the gate electrode.

3. The method of claim 2, wherein the gate contact, the source contact, and the drain contact are formed by the steps of:

applying a electrode layer over the epitaxial layer and the gate oxide layer; and patterning the applied electrode layer to provide gaps that separate the source contact and the drain contact from the gate electrode.

4. The method of claim 1, wherein the drift region is self-aligned with the gate electrode, and wherein the source region is non self-aligned with the gate electrode.

5. The method of claim 1, wherein the source region and the drain region are N+ doped, wherein the drift region is N− doped, and wherein the epitaxial layer is P− doped.

* * * * *